United States Patent

Fujii et al.

[11] Patent Number: 5,991,344
[45] Date of Patent: *Nov. 23, 1999

[54] MOBILE COMMUNICATION DEVICE AND METHOD FOR SETTING AFC INITIAL VALUE

[75] Inventors: Hironori Fujii, Hino; Hiroshi Sato, Kunitachi; Hayato Shiina, Shirogama-machi, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/874,283

[22] Filed: Jun. 13, 1997

[30] Foreign Application Priority Data

Jun. 14, 1996 [JP] Japan ................... 8-153910

[51] Int. Cl.$^6$ .................................................. H04L 27/06
[52] U.S. Cl. .......................................... 375/344; 455/182.2
[58] Field of Search ...................................... 375/280, 281, 375/316, 329, 332, 344; 455/192.2, 192.1, 182.2, 257; 329/304

[56] References Cited

U.S. PATENT DOCUMENTS

| | | | |
|---|---|---|---|
| 5,457,716 | 10/1995 | Ang et al. | 375/344 |
| 5,483,686 | 1/1996 | Saka et al. | 455/182.2 |
| 5,500,878 | 3/1996 | Iwasaki | 375/327 |
| 5,579,346 | 11/1996 | Kanzaki | 375/327 |
| 5,604,746 | 2/1997 | Oto | 375/326 |
| 5,634,205 | 5/1997 | Kurisu et al. | 455/182.2 |
| 5,727,027 | 3/1998 | Tsuda | 375/327 |

*Primary Examiner*—Chi H. Pham
*Assistant Examiner*—Emmanuel Bayard
*Attorney, Agent, or Firm*—Finnegan, Henderson, Farabow, Garrett & Dunner, L.L.P.

[57] ABSTRACT

Provides a mobile communication device and a method for setting an AFC initial value which enables the transmission of required frequency signals even when there is no received signal as during inspections of mobile communication device performance such as technical standards conformance certification. Makes it possible to input an established frequency signal that includes a unique word into the mobile communication device as a received signal, to store a frequency offset value detected by an automatic frequency control function when the unique word included in this established frequency signal is detected in the mobile communication device, and to transmit a more accurate frequency signal when testing the performance of the mobile communication device by controlling the automatic frequency control function so that this stored frequency offset value is treated as an initial value.

7 Claims, 10 Drawing Sheets

MOBILE COMMUNICATION DEVICE AND METHOD FOR SETTING AFC INITIAL VALUE

BACKGROUND OF THE INVENTION

1. Field of the Invention

The present invention relates to portable radiotelephones and other mobile communication devices and a method for setting the automatic frequency control (AFC) initial value for an AFC function.

2. Description of the Related Art

Portable radiotelephones are generally configured as shown in FIG. 10. That is, signals received via the antenna in the radio component (101) are subjected to down-conversion, delayed wave detection and demodulation, then digitized in the A/D, D/A converter (102) and sent on to an ASIC (application specific LSI) signal processor (103).

The ASIC signal processor (103) detects phase errors, and regenerates the clock and received data, then sends the regenerated clock and received data to a voice compression expander (104) configured by the digital signal processor (DSP), and a coder-decoder (105) configured by the PCM codec.

The voice compression expander (104) carries out signal expansion processing, and the coder-decoder (105) decodes the expanded signal, converts it to an analog voice signal and sends it to a microphone-speaker audio component (106), where voice is generated.

Conversely, voice input from the microphone-speaker audio component (106) is changed into a signal, this signal is sent to the coder-decoder (105) for decoding, then sent to the voice compression expander (104), where it undergoes voice expansion processing and is sent to the signal processor (103).

The signal processor (103) modulates the signal for transmission, and sends it to the A/D, D/A converter (102).

The transmission voice signal converted to an analog signal by the A/D, D/A converter (102) is sent to the radio component, where it is up-converted and transmitted via the antenna.

The ASIC controller (107) controls each component in this portable radiotelephone. The ASIC controller and each of the other components operate by receiving power supplies from the power source (108).

The power source (108) is powered by a commercial power source (109) or a back-up battery (110), and this power source charges the back-up battery (110).

Program memory (111), in which programs are stored, SRAM (112), which is used as working memory, and an EEPROM (113) for storing abbreviated dialing data are connected to the ASIC controller (107), as are an LCD driver (115) for controlling the LCD (114), and a key input detection circuit (117) that detects key operations in the dial key-equipped key matrix (116), and sends to the ASIC controller (107) codes corresponding to the operated keys.

The ASIC controller (107) and the ASIC signal processor (103) comprise an integrated ASIC (118), and the LCD (114) and LCD driver (115) comprise a display component (119).

Mobile communication devices are generally equipped with AFC such as that depicted in FIG. 11. A received radio frequency signal (RF) is guided to a mixer (120), where it is down-converted to an intermediate frequency signal using output from a voltage controlled oscillator (VCO) comprising a local oscillator, then guided to a bandpass filter (BPF), which extracts the intermediate frequency signal (IF) to be sent to an orthogonal demodulator (123).

This IF signal is broken down into I-channel and Q-channel signals by the orthogonal demodulator (123), these signals are sent to respective low pass filters (124, 125), where unnecessary frequencies are removed, then to A/D converters (126, 127), where they are converted into digital data, then on to an orthogonal wave detector (128) in a modem (130).

In the orthogonal wave detector (128), I-channel data and Q-channel data are expressed as phase function data, and this phase function data is input to a frequency offset detector (129).

The frequency offset detector (129) detects frequency offset on the basis of the phase function data, that is, it performs phase offset detection, and detection results are sent to a D/A converter (131), where they are converted into a digital signal.

This digital signal is sent to a low pass filter (132), where it undergoes error integration, and the results are then input to the VCO (121).

The VCO (121) changes oscillation frequencies according to the voltage input, and sends the output to the mixer (120).

In this way, AFC is carried out on the frequencies of received signals, and requires feedback to reduce phase error.

Portable radiotelephones are also equipped with the above-described AFC, the AFC-related component of a conventional portable radiotelephone being configured specifically as shown in FIG. 12.

With this portable radiotelephone, the received signal (RSSI) level detected in advance by a diode (141) is digitized by an RSSI A/D converter (143) within an A/D-D/A block (142), the output from this A/D converter (143) is acquired by a diversity controller (144), which controls a PIN diode switch (SW) (145) on the basis of this value. The outcome of this determines the selection of one of the two antennas (147, 148) in the antenna component (146).

The transmitted signal is received by the antenna component (146), and the frequency of the received signal is down-converted by a first local oscillation synthesizer (151) and a second local oscillation synthesizer (152).

Bandpass filters (BPF) (153, 154) are provided to extract signals of the required frequency from the down-converted output of the respective synthesizers (151, 152) described above.

Output from this bandpass filter (154) is sent to an AFC circuit (155) indicated by a dotted line, and the orthogonal demodulator (156) in the AFC circuit (155) breaks this output down into I- and Q-channel analog signals (ARI, ARQ).

The analog signals (ARI, ARQ) are digitized by A/D converters (157, 158) in the A/D-D/A block (142), and sent to a delayed wave detector (159) in the signal processing block (160).

The delayed wave detector (159) expresses the I-channel data and Q-channel data as phase function data, and this phase function data is input to a frequency offset detector (161).

The frequency offset detector (161) performs frequency offset detection based on the phase function data, the results of this detection process are sent to a low pass filter (162) for error averaging, and then on to a D/A converter (163), where they are converted into an analog signal. This analog signal is then input to a VCTCXO (164), which is a voltage controlled oscillator.

The VCTCXO (164) oscillates by changing its oscillation frequency in accordance with the voltage input, and sends the output to a first local oscillation synthesizer (151), a second local oscillation synthesizer (152), and then, via a frequency divider and phase shifter, on to an orthogonal demodulator (156).

In this way, AFC is carried out on the frequencies of received signals, and requires feedback to reduce phase error.

However, because mobile communication devices such as the portable radiotelephone described above make use of techniques that gradually reduce frequency offset while providing feedback based on received signals, during checks to certify conformance to technical standards, for example, there are times when these mobile communication devices are unable to satisfy the specifications for technical standards conformance certification.

That is, during technical standards conformance certification testing, a frequency corresponding to a specific channel must be transmitted without a received signal, but since conventional mobile communication devices such as the one described above input the central value of the AFC signal into a VCTCXO (164), no consideration is given to the temperature characteristics, power fluctuations, load fluctuations, deformation over time or manufacturing irregularities of the VCTCXO, and no thought is given to condigit errors or convergence bias errors in the A/D converters, so that conventional mobile communication devices have not always been able to satisfy the specifications for technical standards conformance certification.

SUMMARY OF THE INVENTION

An object of the present invention is to provide a mobile communication device capable of transmitting a required frequency signal even when there is no received signal, as in the case of technical standards conformance certification.

Further, another object of the present invention is to provide a method for setting an AFC initial value for enabling the transmission of signals that conform to technical standards conformance certification.

To achieve the object described above, the invention in claim 1 comprises: a radio signal receiving means, which receives radio signals; a mixer, which converts the radio signals received via the radio signal receiving means to intermediate frequencies; a voltage controlled oscillator, which sends local oscillation signals to the mixer; a demodulation means, which demodulates signals output from the mixer; an automatic frequency control means, which detects a frequency offset value of a demodulated signal relative to a specific reference frequency based on the demodulated signal output from the demodulation means, and which controls a frequency of the local oscillation signal generated from the voltage controlled oscillator in correspondence with the pertinent detected frequency offset value; a storage means, which stores the frequency offset value detected by the automatic frequency control means when an established frequency radio signal is input to the radio signal receiving means; and an initial value control means, which drives the frequency offset value stored in the storage means as an initial value of the automatic frequency control means.

Further, the invention in claim 2 is configured so that, in the invention in claim 1, the automatic frequency control means comprises: a frequency offset detection means, which detects the frequency offset value of the pertinent demodulated signal relative to the specific reference frequency based on the demodulated signal output from the demodulation means; a frequency sweep means, which generates a sequentially changing frequency scan value for scanning the frequencies of the local oscillation signals generated by the voltage controlled oscillator; a detection means, which detects whether or not the frequency offset value of the demodulated signal relative to the reference frequency falls within the specified range; and a selection means, which outputs the frequency scan value generated from the frequency sweep means when the frequency offset value of the demodulated signal relative to the reference frequency is determined by the detection means to be outside the specified range, and which outputs the frequency offset value detected by the frequency offset detection means when the frequency offset value of the demodulated signal relative to the reference frequency is determined by the detection means to be within the specified range, and this automatic frequency control means controls the frequency of the local oscillation signal generated from the voltage controlled oscillator in correspondence with the output of the selection means.

Further, the invention in claim 3 is configured so that, in the invention in claim 2, the radio signal received by the radio signal receiving means is a QPSK-modulated signal, and the detection means detects whether or not the frequency offset is within the specified range based on the MSB of the demodulated digital signals in the I-path and Q-path of the QPSK modulation.

Further, the invention in claim 4 is configured so that, the invention in claim 2 further comprises: a data restoration means, which restores received data based on the demodulated signal output from the demodulation means; and a synchronization detection means, which detects synchronism from the fact that a unique word is detected in the received data restored by the restoration means, and the storage means stores as the frequency offset value the frequency scan value generated from the frequency sweep means when synchronism is detected by the synchronization detection means when a radio signal with an established frequency is input to the radio signal receiving means.

Further, the invention in claim 5 is configured so that, in the invention in claim 1, the storage means comprises a non-volatile memory.

Further, the invention in claim 6 is configured so that, in the invention in claim 1, the initial value control means is utilized to control the frequency of the radio transmission signal transmitted from the mobile communication device when testing the performance of this mobile communication device.

Further, the invention in claim 7 is a method for setting an AFC initial value of a mobile communication device that possesses an automatic frequency control means, which detects a frequency offset value of a received signal relative to a specific reference frequency, and which controls a voltage controlled oscillator that generates a local oscillation signal that is added to a mixer that down-converts the received signal in correspondence with the pertinent detected frequency offset value, the method comprising: a first step of inputting an established frequency signal that includes a unique word as the received signal; a second step for detecting the unique word contained in the establish frequency signal input the in the first step; a third step of storing the frequency offset value detected by the automatic frequency control means when the unique word is detected in the second step; and a fourth step of setting as the initial value of the automatic frequency control means the frequency offset value stored in the third step when controlling the radio transmission signal transmitted from the mobile communication device when testing the performance of the mobile communication device.

Further, the invention in claim 8 is configured so that, in the invention in claim 7, the first step is carried out for switching signals to input a plurality of established frequency signals as the established frequency signal, and the third step is carried out for storing the frequency offset value in association with each of the aforementioned plurality of established frequency signals.

Further, the invention in claim 9 is configured so that, in the invention in claims 7 or 8, the automatic frequency control means comprises: a frequency offset detection means, which detects the frequency offset value of the received signal relative to the specific reference frequency; a frequency sweep means, which generates a sequentially changing frequency scan value for scanning the frequencies of local oscillation signals generated from the voltage controlled oscillator; a detection means, which detects whether or not the frequency offset value of the received signal relative to the specific reference frequency is within the specified range; and a selection means, which outputs the frequency scan value generated from the frequency sweep means when the frequency offset value of the received signal relative to the specific reference frequency is determined by the detection means to be outside the specified range, and which outputs the frequency offset value detected by the frequency offset detection means when the frequency offset value of the received signal relative to the reference frequency is determined by the detection means to be within the specified range, and the automatic frequency control means controls the frequency of the local oscillation signal generated from the voltage controlled oscillator in correspondence with the output of the selection means, and the third step is carried out for storing as the frequency offset value the frequency scan value generated from the frequency sweep means when the unique word is detected in the second step.

DESCRIPTION OF THE PREFERRED EMBODIMENTS

The following description references the attached figures to describe a mobile communication device related to the configurations of the embodiments of the present invention and a method for setting the AFC initial value for that device. Repetitive descriptions of the same components with the same symbols in each of the figures are omitted. A portable radiotelephone is used as an example in describing a mobile communication device related to the configurations of the embodiments of the present invention. A block diagram of this portable radiotelephone is as shown in FIG. 10, the configuration and functions of which have already been described.

Figure 1:
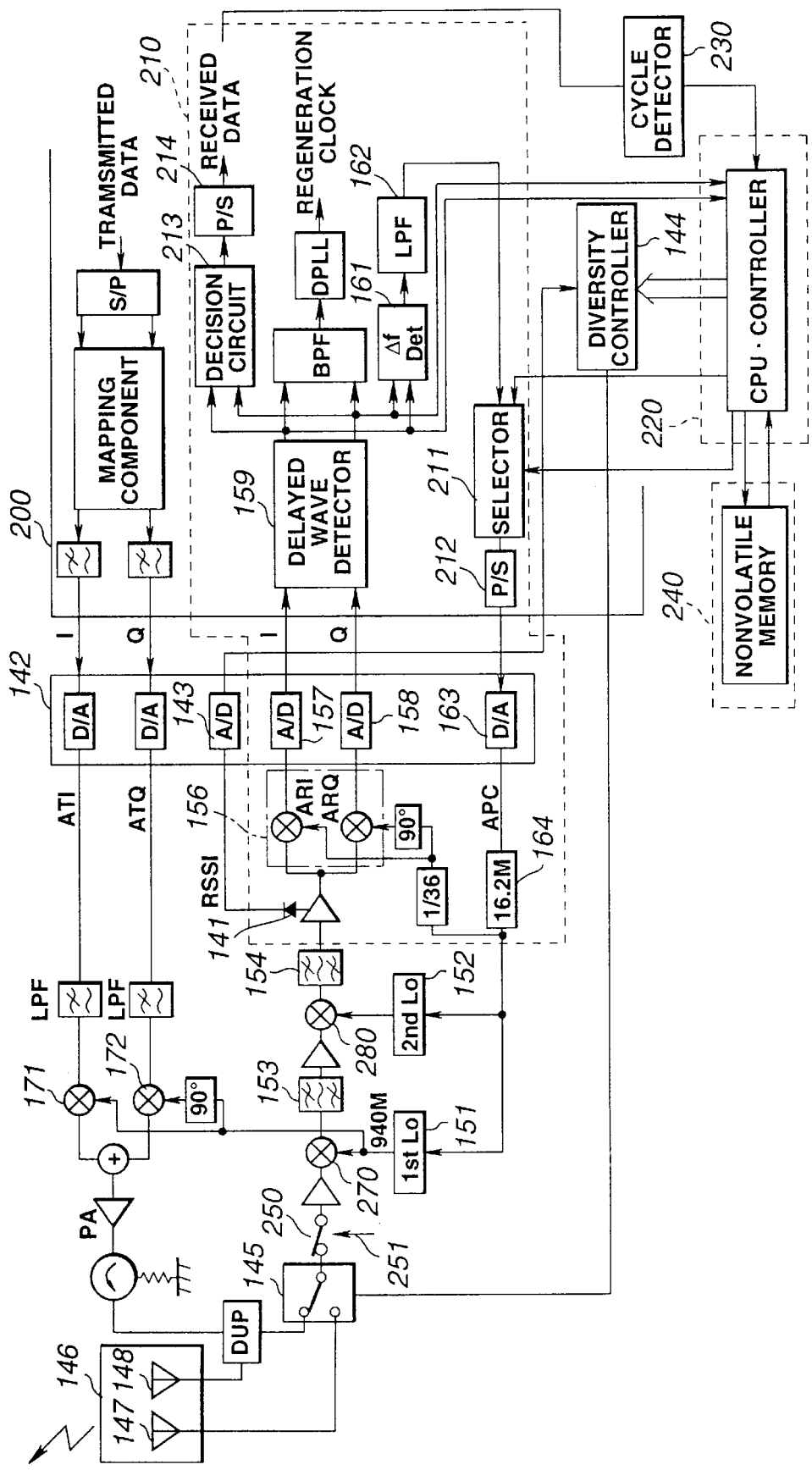
FIG. 1 is a block diagram of the essential part of a portable radiotelephone related to the configuration of the embodiment of the present invention.
Figure 10:
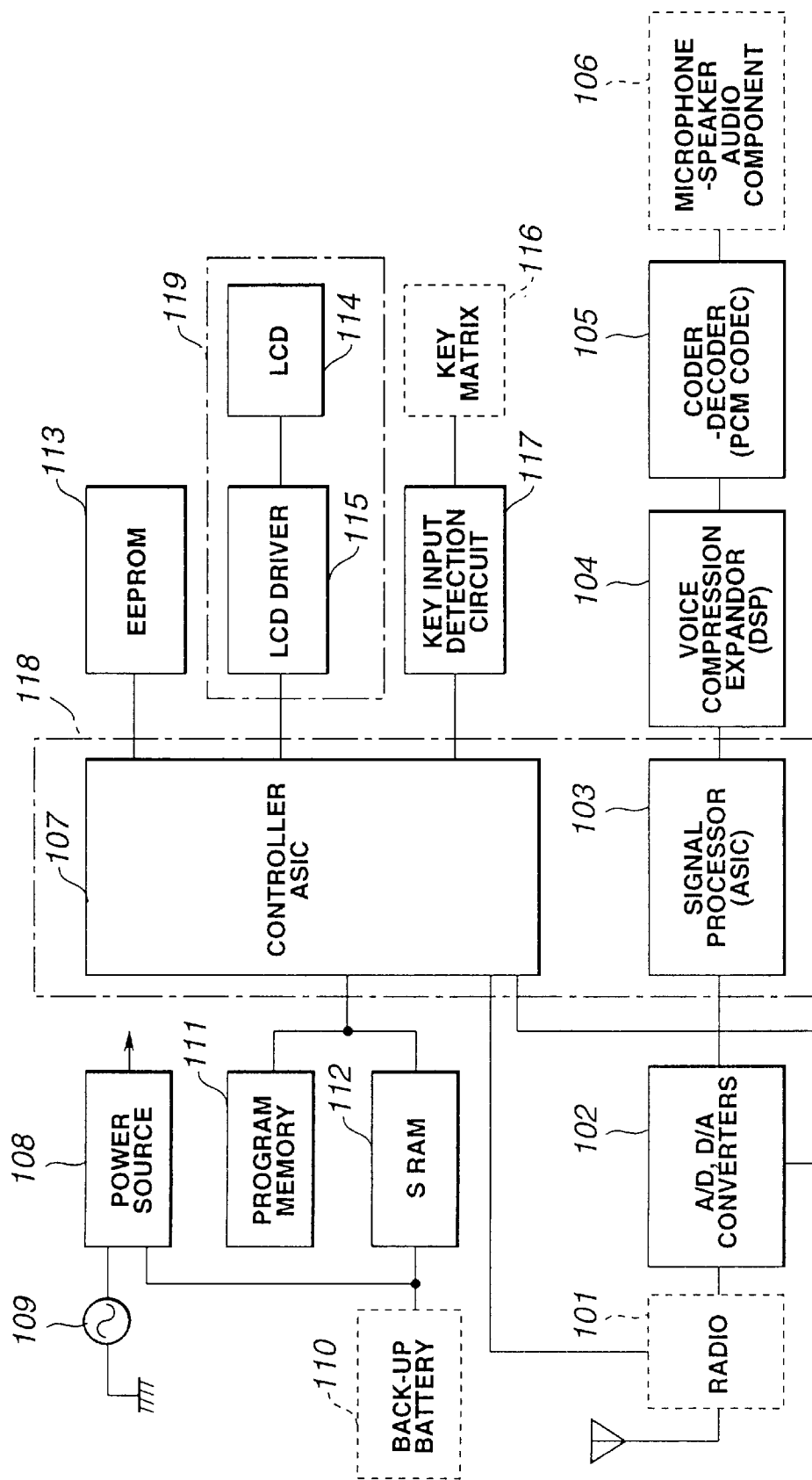
FIG. 10 is a block diagram of a portable radiotelephone related to the configuration of the embodiment of the present invention.
Figure 11:
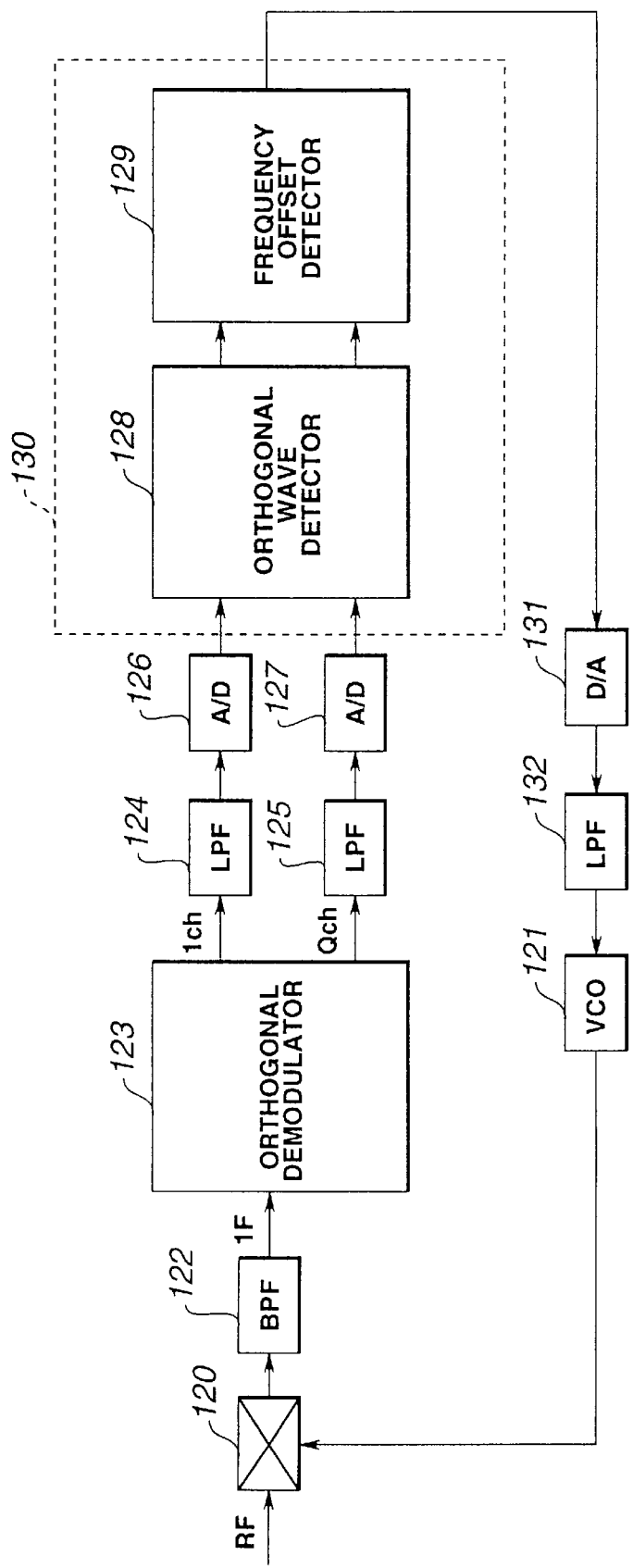
FIG. 11 is a general block diagram of AFC used in mobile communication devices.

The present invention, as shown in FIG. 1, comprises the essential components of the portable radiotelephone depicted in the aforementioned FIG. 10, a radio (101), an A/D-D/A converter (102) and a signal processor (103).

Figure 12:
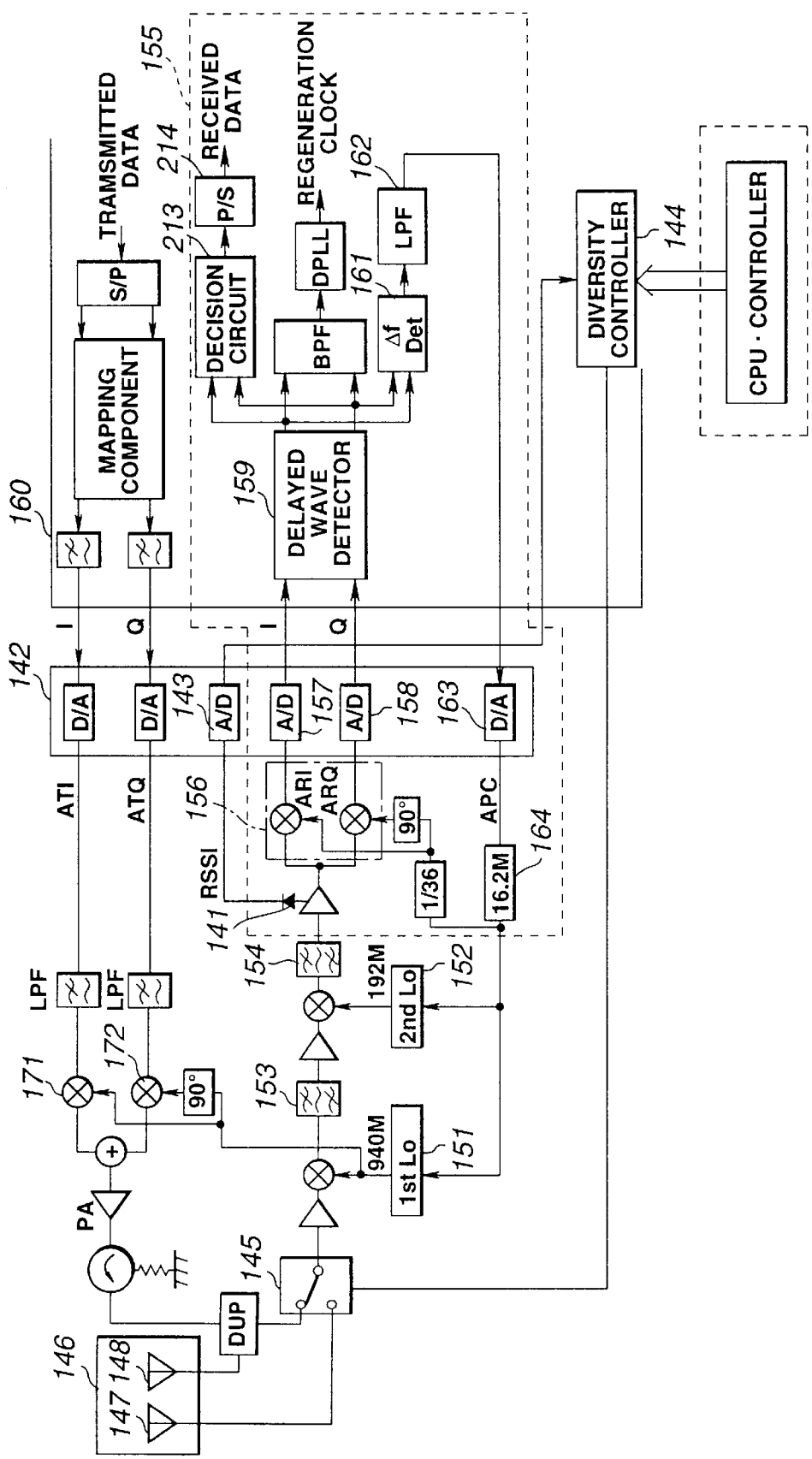
FIG. 12 is a block diagram of the essential parts of a conventional portable radiotelephone.

That is, the configuration of the portable radiotelephone depicted in FIG. 1 attaches the same symbols to the same components shown in the example of a conventional configuration depicted in FIG. 12. In this configuration example, a switch (250) is included after a PIN diode SW (145), and when an input terminal (251) from an interface tester is inserted, the aforementioned switch (250) opens so as to accept only the signal input from the interface tester via the input terminal (251).

Further, output from a low pass filter (162) in an AFC circuit (210) is guided to a selector (211).

An AFC signal from a CPU.controller (220) is input to the selector (211).

The selector (211), under the control of the CPU.controller (220), selects a signal, and outputs that signal to a parallel/serial converter (P/S) (212). The parallel/serial converter (212) serializes the signal, and that output is converted from a digital signal to an analog AFC signal by a D/A converter (163), and input to a VCTCXO (164).

The VCTCXO (164) outputs a signal with a frequency corresponding to the input analog AFC signal.

Further, the CPU.controller (220) acquires output from a delayed wave detector (159), based on which it functions as a selector control means, which controls selector (211) changeover.

Figure 2:
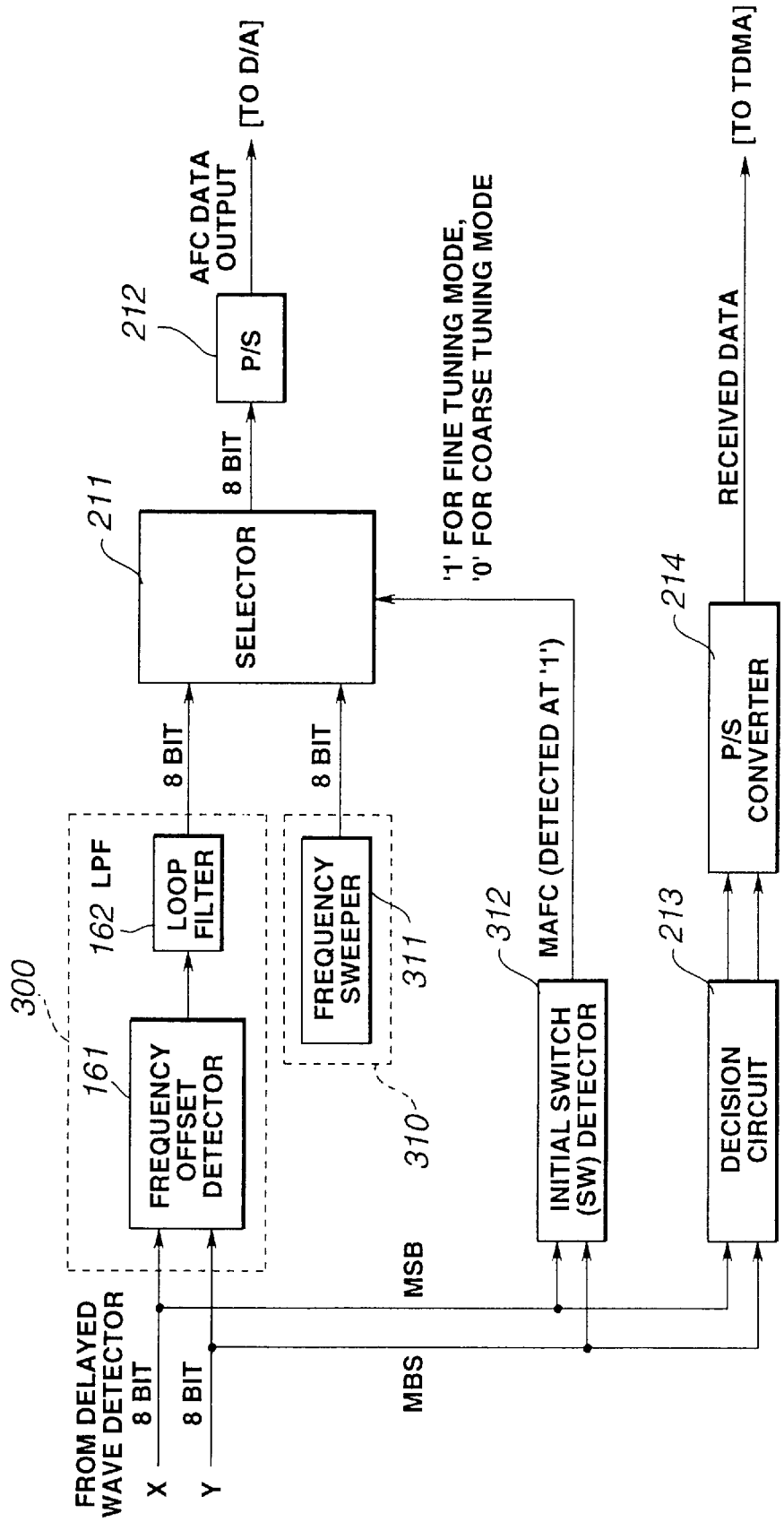
FIG. 2 is a block diagram of an AFC circuit, which is an essential part of a portable radiotelephone related to the configuration of the embodiment of the present invention.

FIG. 2 is a block diagram depicting the essential parts of the above-described AFC circuit (210). As shown in the figure, a frequency offset detector (161) and an LPF (162) serving as a loop filter comprise a normal mode component (300).

A frequency sweeper (311) in a coarse tuning mode component (310) generates variable signals equivalent to output signals from the frequency offset detector (161), and simulates frequency sweep of receiving signals.

The MSBs of the respective X and Y 8-bit outputs from the delayed wave detector (159) are extracted, and guided to an initial SW detector (312) and a decision circuit (213).

The initial SW detector (312) is originally set to the coarse tuning mode (310), but when the frequency offset decreases and the appearance of specified value 1 (the incoming word makes both X and Y equivalent to 1) is detected in the respective MSBs of the 8-bit X and Y outputs from the delayed wave detector (159), the initial SW detector switches the selector to the normal mode (300). This initial SW detector (312) and frequency sweeper (311) depict in block form the functions performed by the CPU.controller (220).

Further, the decision circuit (213) shown in FIG. 1 and FIG. 2 described above, decides, on the basis of the X and Y MSBs, whether the respective data is 1 or 0, and outputs the result of that decision to a parallel/serial converter (P/S) (214). The P/S converter (214) converts the output from the decision circuit (213) to serial data and sends it to a DTMA not shown in the figures.

In this way, the decision circuit (213) and P/S converter (214) function as a data restoration means, which restores incoming data based on signals input from the frequency offset detector (161).

Figure 3:
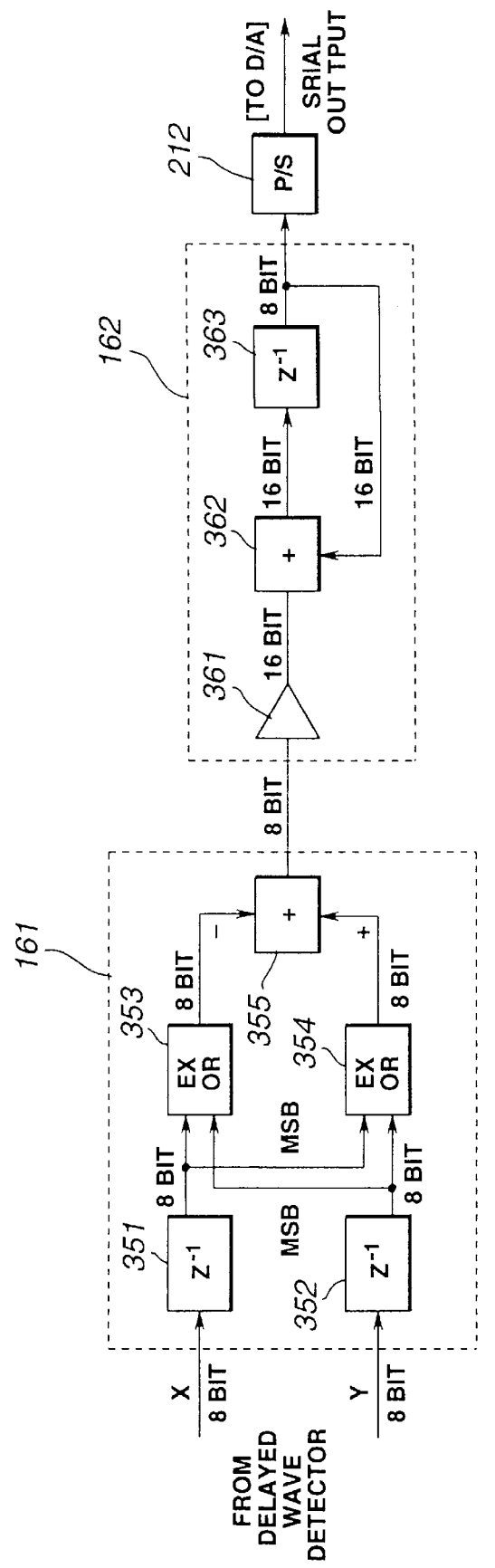
FIG. 3 is a block diagram of normal operating mode components, which are essential parts of a portable radiotelephone related to the configuration of the embodiment of the present invention.

FIG. 3 depicts the detailed configuration of the aforementioned normal mode component (300). The frequency offset detector (161) delays the output of the delayed wave detector (159) in delay circuits (351, 352), then guides that output to exclusive OR elements (353, 354) in the subsequent stage, and inputs the MSBs output by the delayed wave detector (159) into the cross-positioned exclusive OR elements (353, 354. The output of the exclusive OR elements (353, 354) is input to an adder (355) and added.

Output from the frequency offset detector (161) is sent to the low-pass filter (162). The low-pass filter (162) comprises an AFC gain adjustment amp (361), an adder (362) and a delay circuit (363), and is configured so that the outputs from the amp (361) and delay circuit (363) are added by the adder (362).

The operation of the above-described normal mode component (300) can be explained using the following expressions.

If $\phi(t)$ is the phase transition of a $\pi/4$ shift QPSK modulated signal, and fO is the frequency offset, the input signal can be expressed as $I(k) = \cos(\phi(k) + 2\pi fOk)$ $Q(k) = \sin(\phi(k) + 2\pi fOk)$ Then, delayed wave detection output becomes $X(k) = I(k) \cdot I(k-1) - Q(k) \cdot Q(k-1) = \cos(\phi(k) - \phi(k-1) + 2\pi fO)$ $Y(k) = Q(k) \cdot I(k-1) - I(k) \cdot Q(k-1) = \sin(\phi(k) - \phi(k-1) + 2\pi fO)$ Here, if the frequency offset(fO) is sufficiently smaller than $\pi/4$, when the approximate values of X (k) and Y (k) are changed to X (k)' and Y (k)', respectively, the correct demodulation output is expressed as $X(k)' = \cos(\phi(k) - \phi(k-1))$ $Y(k)' = \sin(\phi(k) - \phi(k-1))$ and since $2\pi fO$ is small, the frequency output becomes $2\pi fO = \sin(2\pi fO) = X(k)Y(k)' - X(k)'Y(k)$ and the calculation indicated by this final expression, as shown in the frequency offset detector (161) depicted in FIG. 3, is obtained by the frequency offset detector (161) delaying the output of the delayed wave detector (159) in the delay circuits (351, 352), then guiding that output to the exclusive OR elements (353, 354) in the subsequent stage, inputting the MSBs output by the delayed wave detector (159) into the cross-positioned exclusive OR elements (353, 354), and inputting the outputs of the exclusive OR elements (353, 354) to an adder (355) and adding them.

Figure 8:
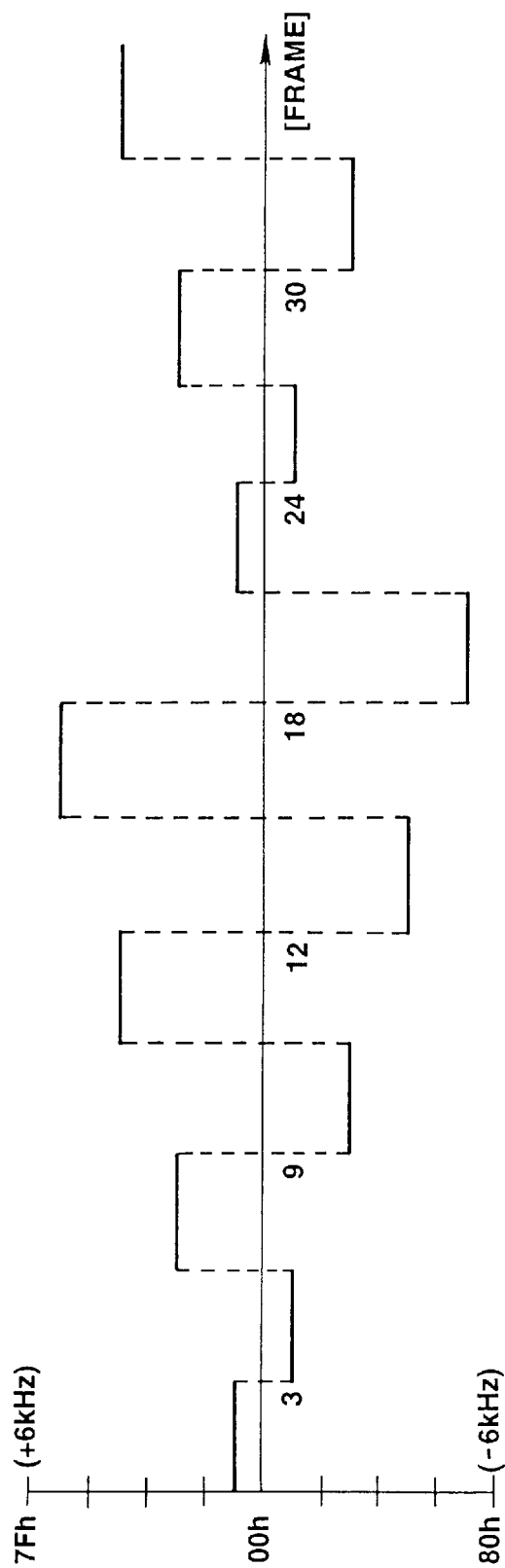
FIG. 8 is a diagram for explaining frequency step in a portable radiotelephone related to the configuration of the embodiment of the present invention.

In a portable radiotelephone configured as described above, the normal mode component (300) operates as follows at power input or at power interruption. At power input or at power interruption, the CPU-controller (220) detects this change in power and causes the initial SW detector (312) to control the selector (211) so as to select the output from the frequency sweeper (311). The frequency sweeper (311), as shown in FIG. 8, for example, generates AFC signals that change in eight stages the range of the oscillation frequency of the VCTCXO (164) plus-or-minus 6 kH from the central value.

The generation time of signals corresponding to each frequency is equivalent to three (3) frames. When this kind of frequency sweep is performed, the output AFC signal is serialized by the P/S converter (212), then sent to the D/A converter (163) where it is converted into an analog signal. This analog signal is input to the VCTCXO (164), which is a voltage controlled oscillator.

The VCTCXO (164) oscillates by changing its oscillation frequency in accordance with the input voltage, and sends the output to a first local oscillation synthesizer (151), a second local oscillation synthesizer (152), and then, via a frequency divider and phase shifter, on to an orthogonal demodulator (156).

The received signal is frequency down-converted in mixers (270, 280) by the output from the first local oscillation synthesizer (151) and second local oscillation synthesizer (152).

Figure 9:
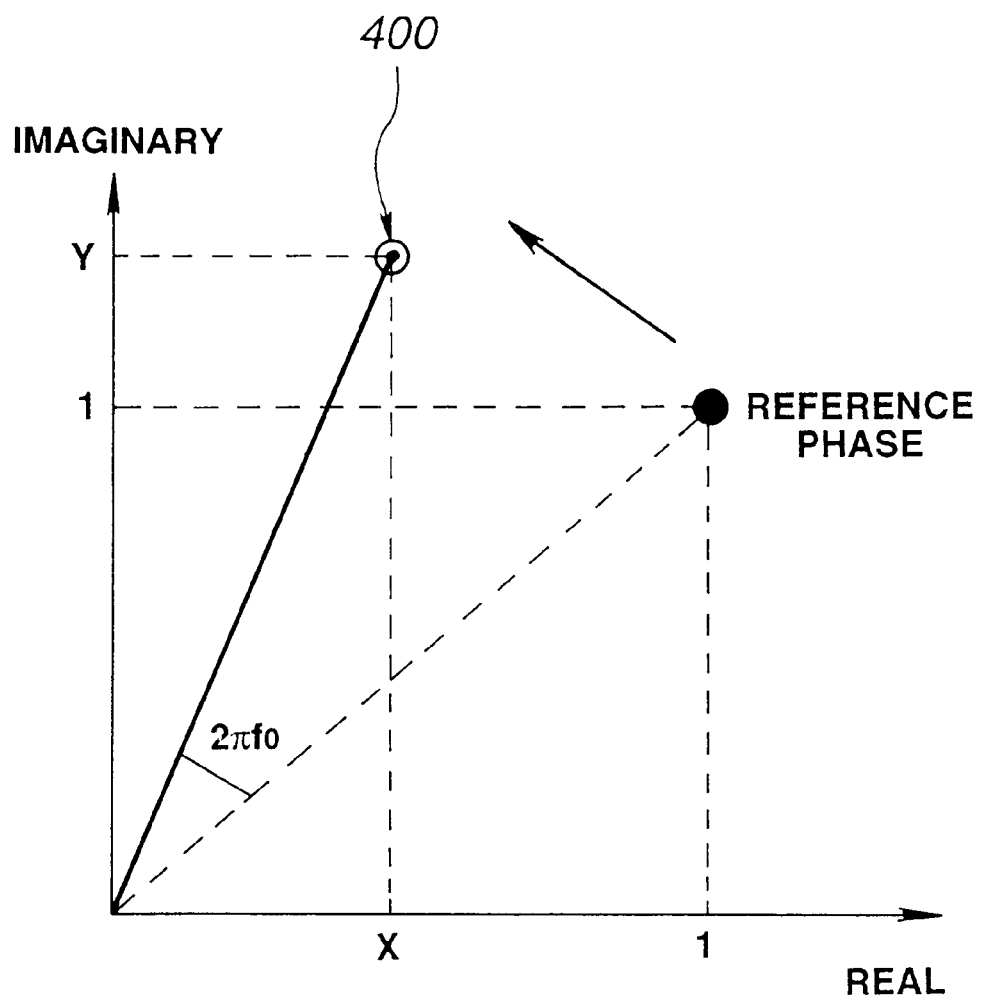
FIG. 9 is a diagram for explaining the frequency offset of a signal in a portable radiotelephone related to the configuration of the embodiment of the present invention.

Then, at power input or at power interruption, when data is sent from a remote device, making both the X and Y outputs of the delayed wave detector (159) 1, and when the range of frequency error ($2\pi fO$) is greater than plus-or-minus $\pi/4$ from the reference phase as shown in FIG. 9, the output from the frequency sweeper (311) is selected as-is without 1 being expressed in at least one of the MSB input to the initial SW detector (312).

Conversely, when the range of the frequency error ($2\pi fO$) is within plus-or-minus $\pi/4$ of the reference value, ones (1) are reflected in both of the MSB values input to the initial SW detector (312), and the output from the normal mode component (300) is selected instead of the output from the frequency sweeper (311).

After that, operation is carried out using the output from the normal mode component (300).

When it comes to operation based on output from the above-described frequency sweeper (311), because the normal mode component (300) detects frequency offset using output from the delayed wave detector (159), frequency offset is within the plus-or-minus $\pi/4$ range regardless of whether the selector (211) switches to the normal mode component (300), guaranteeing suitable reception thereafter.

However, the configuration of the embodiment of the present invention is configured as follows to enable the sending of suitable transmission signals even without a receiving signal at technical standards conformance certification.

That is, the present invention possesses a synchronization detector (230), which detects whether or not received data related to P/S converter (214) output is a unique word with a specified bit pattern, and the results of this detection operation are input to the CPU.controller (220).

Further, non-volatile memory (240) (for example, the EEPROM (113) shown in FIG. 10) for storing the AFC initial value resulting from a frequency sweep is connected to the CPU.controller (220).

In this way, the synchronization detector (230) functions as a unique word detection means, which receives restored data and detects the reception of a unique word, and non-volatile memory (240) and the CPU.controller (220) function as an AFC initial value holder means, which takes in and holds the AFC signal output from the frequency sweeper (311) when the aforementioned unique word is detected.

Figures 4A, 4B:
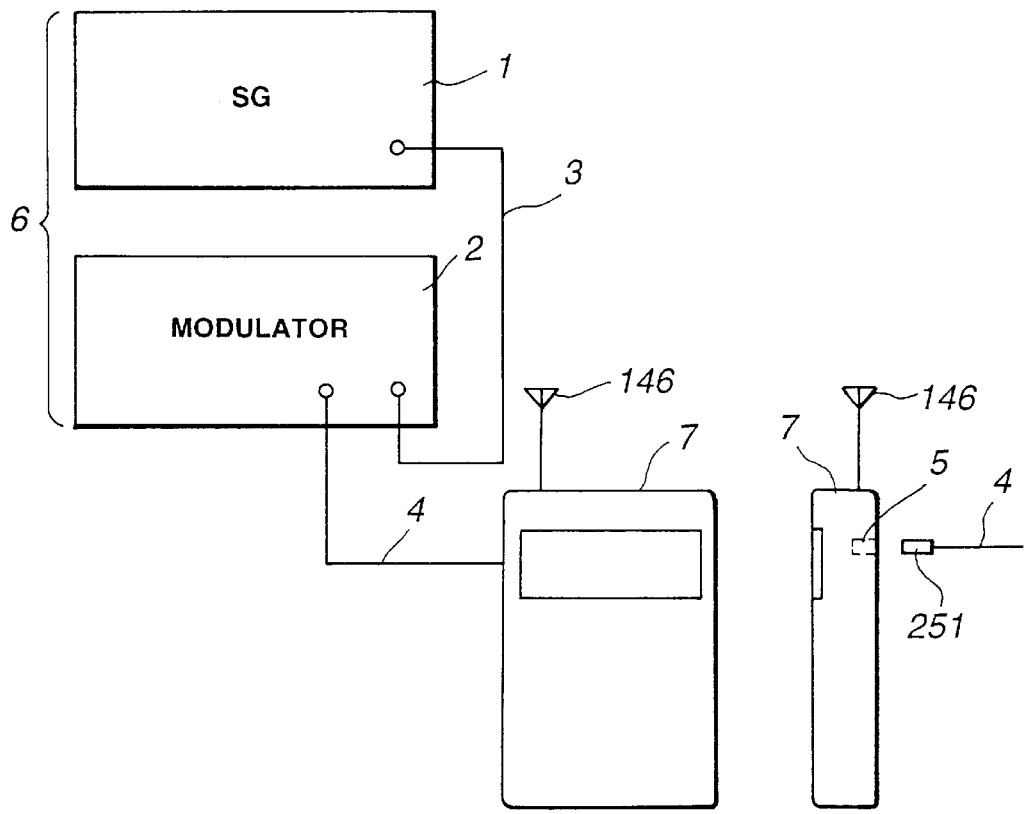
FIGS. 4(*a*) and 4(*b*) are block diagrams depicting interface testing of a portable radiotelephone related to the configuration of the embodiment of the present invention.

Then, when setting the AFC initial value, the present invention is configured as shown in FIGS. 4(a) and 4(b).

That is, an interface tester (6) comprising a signal generator (1) and a modulator (2) connects via a cable (4) to a portable radiotelephone (7) related to the configuration of this embodiment. Then, in accordance with the setting, a frequency signal corresponding to a channel, for example, can be output from the signal generator (1) via a cable (3).

The signal output from the cable (3) is modulated by the modulator (2), and output via a cable (4). A unique word is generated by the modulator (2) at this time, resulting in a modulated signal.

FIGS. 4(a) and 4(b) also depict a front view 4(a) and a side view 4(b) of a portable radiotelephone (7).

Figure 5:
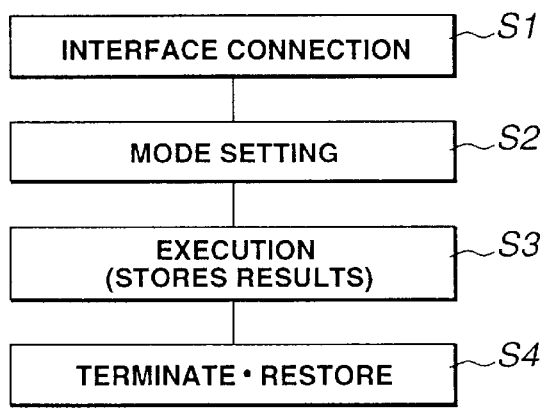
FIG. 5 is a flowchart for setting an AFC initial value for a portable radiotelephone related to the configuration of the embodiment of the present invention.

As shown in 4(b), the portable radiotelephone (7) is equipped with a connector (5) into which an input terminal (251) is inserted. The initial value is then set using the procedure depicted in FIG. 5.

That is, the portable radiotelephone (7) is connected to the interface tester (6) (S1), and set to the frequency sweep mode (S2). More specifically, specified keys are input (using a key operation not normally employed) from the key matrix (116) of the portable radiotelephone (7) to set the frequency sweep mode. Then, channels or frequencies related to transmission and reception are specified, a unique word with a specified frequency is sent from the interface tester (6), and frequency sweep processing for setting the AFC initial value is executed (S3).

The results of this processing are stored in non-volatile memory (240). When the frequency sweep process used to set this AFC initial value is complete, the portable radiotelephone (7) is released from the frequency sweep mode (S4). That is, specified keys are input (using a key operation not normally employed) from the key matrix (116) of the portable radiotelephone (7) to release it from the test mode.

As described above, the key matrix (116) of the portable radiotelephone (7) functions as an input means for inputting commands to provide instructions.

Figures 6, 7:
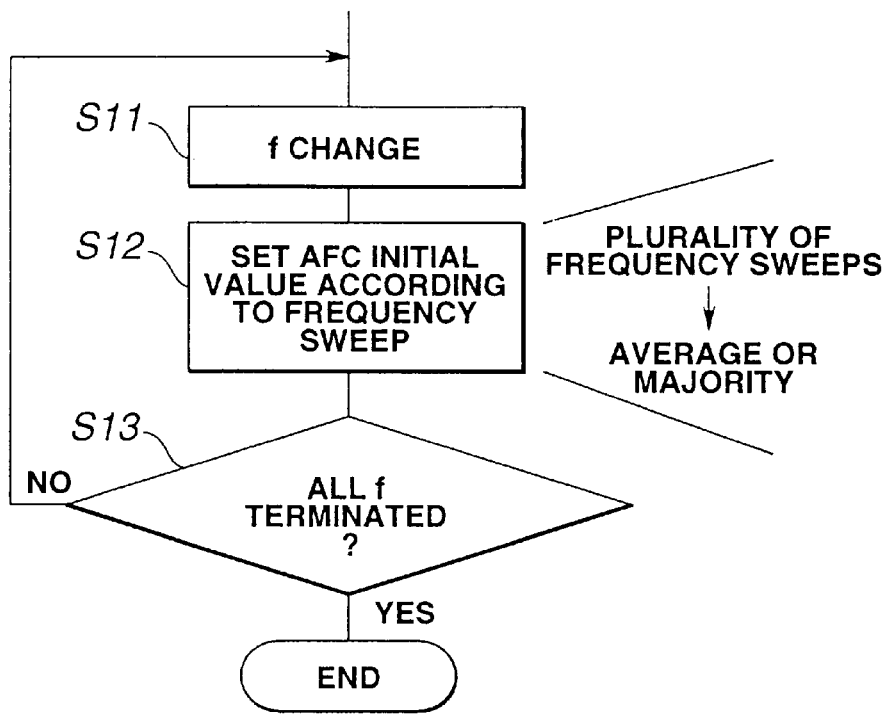
FIG. 6 is a detailed flowchart of the essential elements for setting an AFC initial value for a portable radiotelephone related to the configuration of the embodiment of the present invention.
FIG. 7 is a diagram depicting an example of an AFC initial value table for a portable radiotelephone related to the configuration of the embodiment of the present invention.

FIG. 6 shows the details of step S3 described above. During the execution of frequency sweep processing to set the AFC initial value, the frequency (channel) in the signal generator (1) is changed (S11), the AFC initial value is set by the frequency sweep (S12), the completion of processing for all frequencies (channels) is detected (S13), and when processing for all frequencies (channels) is complete, the operation is terminated.

More specifically, the CPU.controller (220) detects the above-described frequency sweep mode instructions, and causes the initial SW detector (312) to control the selector (211) so as to select the output from the frequency sweeper (311).

Below, as has already been explained for operations at power input, when frequency sweeps are performed, the range of frequency errors ($2\pi fO$) is within plus-or-minus $\pi/4$ of the reference phase, and synchronism is established, the synchronization detector (230), which receives data serialized by the decision circuit (213) and P/S converter (214), can detect unique words. That is, because unique words are being sent from the interface tester (6), when the initial SW detector (312) detects a 1 in two MSBs, the synchronization detector (230) detects the unique words and notifies the CPU.controller (220) of these detections.

Upon receiving this, the CPU.controller (220) detects and stores the data the frequency sweeper (311) is outputting.

The CPU.controller (220) includes a frequency sweeper (311), facilitating the above-mentioned storage of sweep results. This processing continues for each channel (frequency), and the results are compiled into a table like that shown in FIG. 7 and stored in non-volatile memory (240).

Also, when frequency sweep is executed a plurality of times for the same channel (frequency), as indicated in step S12 in FIG. 6, either the average of these results, or a majority value is selected and stored as the AFC initial value.

The AFC initial value stored in non-volatile memory (240) as described above is utilized as follows during technical standards conformance certification.

A specified key input (by a key operation not normally used) is performed from the key matrix (116) of the radiotelephone (7), setting the technical standards conformance certification mode and inputting instructions concerning the channel (frequency) to be transmitted.

The CPU.controller (220) detects the above-mentioned technical standards conformance certification mode instructions, reads out corresponding data from non-volatile memory (240) and sends that data to the selector (211).

The selector (211) is setup by the CPU.controller (220) to select output from the CPU.controller (220).

In this way, the CPU.controller (220) functions as an AFC signal control means, which inputs the AFC control signal held in non-volatile memory (240) to the voltage controlled oscillator VCTCXO (164) at the specified time. As a result, the frequency signal output from the VCTCXO (164) at frequency synchronization, that is, when the range of frequency errors ($2\pi fO$) is within plus-or-minus $\pi/4$ of the reference phase, is input to the first local oscillator (151), and the output from the first local oscillator (151) is sent via transmitter-side mixers (171, 172) and up-converted, thus enabling the sending of a transmission signal based on a specified range of frequencies that satisfy the specifications for technical standards conformance certification.

What is claimed is:

1. A mobile communication device, comprising:
   local oscillation means, which receives an AFC signal and oscillates a local oscillation signal having a frequency corresponding to the AFC signal;
   mixer means, which mixes the local oscillation signal oscillated from the local oscillation means to a received radio signal to convert into an intermediate frequency signal;
   demodulation means, which demodulates the intermediate frequency signal output from the mixer means;
   frequency offset detection means, which detects and outputs a frequency offset value relative to a desired frequency of the received signal based on the demodulated signal output from the demodulation means;
   frequency sweep means, which outputs at a prescribed period a pseudo frequency offset value which alternatively take a positive and a negative value and whose value sequentially changes with respect to a center value of the oscillation frequency of the local oscillation means;

selector means, which selects either one of the output of the frequency offset detecting means and the output of the frequency sweep means, and inputs to the local oscillation means the selected one of the outputs as the AFC signal; and selector control means, which controls the selector means so that the selector means selects the output of the frequency sweep means when the frequency offset value is out of a predetermined range, and selects the output of the frequency offset detecting means when the frequency offset value falls within the predetermined range.

2. The mobile communication device in claim 1, wherein the frequency offset control means detects whether or not the frequency offset value falls within the predetermined range based on the demodulation signal output from the demodulation means, and controls the selection operation of the selector means based on the detection output.

3. The mobile communication device in claim 1, wherein the demodulation means demodulates a QPSK modulated signal to digital signals in I-path and Q-path, the frequency offset control means detects whether or not the frequency offset value falls within the predetermined range based on an MSB of the digital signals in I-path or Q-path, and controls the selection operation of the selector means based on the detection output.

4. The mobile communication device in claim 1, further comprising:

restoration means, which restores a received signal based on the demodulated signal output from the demodulation means;

unique word detection means, which detects a synchronization establishment of the received signal based on the detection of a unique word contained in the received signal restored by the restoration means;

AFC initial value storage means, which stores, as an initial value of the AFC signal, the pseudo frequency offset value being output from the frequency sweep means at the time when the unique word was detected by the unique word detection means when receiving a signal of an established frequency; and AFC initial value control means, which allows the AFC initial value stored in the AFC initial value storage means to be input into the local oscillation means as an initial value of the AFC signal.

5. A method for setting an AFC initial value of a mobile communication device that comprises:

local oscillation means, which receives an AFC signal and oscillates a local oscillation signal having a frequency corresponding to the AFC signal;

mixer means, which mixes the local oscillation signal oscillated from the local oscillation means to a received radio signal to convert into an intermediate frequency signal;

demodulation means, which demodulates the intermediate frequency signal output from the mixer means;

frequency offset detection means, which detects and outputs a frequency offset value relative to a desired frequency of the received signal based on the demodulated signal output from the demodulation means;

frequency sweep means, which outputs at a prescribed period a pseudo frequency offset value which alternatively takes a positive and a negative value and whose value sequentially changes with respect to a center value of the oscillation frequency of the local oscillation means;

selector means, which selects either one of the output of the frequency offset detecting means and the output of the frequency sweep means and inputs to the local oscillation means the selected one of the outputs as the AFC signal;

selector control means, which controls the selector means so that the selector means selects the output of the frequency sweep means when the frequency offset value is out of a predetermined range, and selects the output of the frequency offset detecting means when the frequency offset value falls within the predetermined range;

restoration means, which restores received signal based on the demodulated signal output from the demodulation means; and unique word detection means, which detects a synchronization establishment of the received signal based on the detection of a unique word contained in the received signal restored by the restoration means;

the method comprising:

a first step of controlling by the selector control means so that the selector means selects the output of the frequency sweep means;

a second step of providing a signal of an established frequency that includes the unique word as the received signal;

a third step of detecting the pseudo frequency offset value being output from the frequency sweep means at the time when the unique word detection means has detected the unique word contained in the signal of the established frequency provided in the second step; and a fourth step of storing, as an AFC initial value of the AFC signal, the pseudo frequency offset value detected in the third step.

6. The method for setting an AFC initial value of a mobile communication device in claim 5, wherein the second step is carried out by switching signals among a plurality of prescribed frequency channels as the received signal, the third step is carried out for detecting the pseudo frequency offset values in correspondence with each frequency channel, and the fourth step is carried out for storing, as the AFC initial value, the pseudo frequency offset value in correspondence with each frequency channel.

7. The method for setting an AFC initial value of a mobile communication device in claim 5, wherein the frequency sweep means repeatedly outputs the pseudo frequency offset value in correspondence with a frame of the received signal, the second step is carried out for providing for a plurality of frames the known frequency signals containing the unique word as the received signal, the fourth step is carried out for determining the pseudo frequency offset value to be stored as the AFC initial value based on the plurality of pseudo frequency offset values detected in the third step in correspondence with the plurality of frames.

* * * * *